US012463527B2

United States Patent
Shibuta et al.

(10) Patent No.: US 12,463,527 B2
(45) Date of Patent: Nov. 4, 2025

(54) SEMICONDUCTOR ELEMENT DRIVE DEVICE

(71) Applicant: Mitsubishi Electric Corporation, Tokyo (JP)

(72) Inventors: Yuto Shibuta, Fukuoka (JP); Shohei Higashi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 20 days.

(21) Appl. No.: 18/653,900

(22) Filed: May 2, 2024

(65) Prior Publication Data

US 2025/0096669 A1 Mar. 20, 2025

(30) Foreign Application Priority Data

Sep. 15, 2023 (JP) .................................. 2023-149881

(51) Int. Cl.
*H02M 1/08* (2006.01)
*H03K 17/082* (2006.01)
*H03K 17/18* (2006.01)
*H03K 17/08* (2006.01)

(52) U.S. Cl.
CPC .......... *H02M 1/08* (2013.01); *H03K 17/0826* (2013.01); *H03K 17/18* (2013.01); *H03K 2017/0806* (2013.01)

(58) Field of Classification Search
CPC ....................................................... H02M 1/08
USPC ....................................................... 327/109
See application file for complete search history.

(56) References Cited

U.S. PATENT DOCUMENTS

2017/0134018 A1\* 5/2017 Imanishi .............. H03K 17/567

FOREIGN PATENT DOCUMENTS

| JP | 2009-136115 A | 6/2009 |
| JP | 2014-011708 A | 1/2014 |
| JP | 2017-93065 A | 5/2017 |

\* cited by examiner

*Primary Examiner* — Tomi Skibinski
(74) *Attorney, Agent, or Firm* — Studebaker Brackett PLLC (57) ABSTRACT

An object is to provide a technique which enables an outer portion to identify a type of an error state from an identification signal in an early state. A semiconductor element drive device includes a plurality of error state detection circuits generating an error signal corresponding to an error state, an error state identification signal generation circuit generating an error state identification signal having a different waveform for each type of the error state and having a pulse width smaller than each error signal based on the plurality of error signals generated in the plurality of error state detection circuits, respectively, and an error state identification signal output terminal outputting an error state identification signal.

8 Claims, 8 Drawing Sheets

SEMICONDUCTOR ELEMENT DRIVE DEVICE

BACKGROUND OF THE INVENTION

Field of the Invention

The present disclosure relates to a semiconductor element drive device.

Description of the Background Art

Various techniques are proposed for a semiconductor element drive device driving a semiconductor element. For example, Japanese Patent Application Laid-Open No. 2017-93065 proposes a technique that a semiconductor element drive device generates an identification signal having a different pulse width for each error state, thus an external control device can identify a type of the error state from the identification signal.

SUMMARY

However, the pulse width of the identification signal is larger than the pulse width of the error signal for each error state in the conventional technique, thus a time from start to finish of output of the identification signal is long. Thus, the external control device has a problem that the type of the error state cannot be identified from the identification signal in an early stage.

The present disclosure therefore has been made to solve the above problems, and it is an object to provide a technique which enables an outer portion to identify a type of an error state from an identification signal in an early state.

A semiconductor element drive device according to the present disclosure is a semiconductor element drive device driving a semiconductor element including: a plurality of error state detection circuits each detecting an error state of the semiconductor element or the semiconductor element drive device and generating at least one error signal corresponding to the error state which has been detected; an error state identification signal generation circuit generating an error state identification signal having a different waveform for each type of the error state and having a smaller pulse width than each of the error signals based on the plurality of error signals generated in the plurality of error state detection circuits, respectively; an error state identification signal output terminal outputting the error state identification signal; a protection operation signal generation circuit generating a protection operation signal for protecting the semiconductor element based on the error state identification signal; a protection operation signal output terminal outputting the protection operation signal; and a protection circuit protecting the semiconductor element based on the protection operation signal.

An outer portion can identify a type of the error state from the identification signal in an early stage.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments are described with reference to the appended diagrams hereinafter. Features described in each embodiment described below is exemplification, thus all features are not necessarily applied. The same or similar reference numerals will be assigned to same or similar constituent elements in a plurality of embodiments in the description hereinafter, and the different constituent elements are mainly described hereinafter.

Embodiment 1

Figure 1:
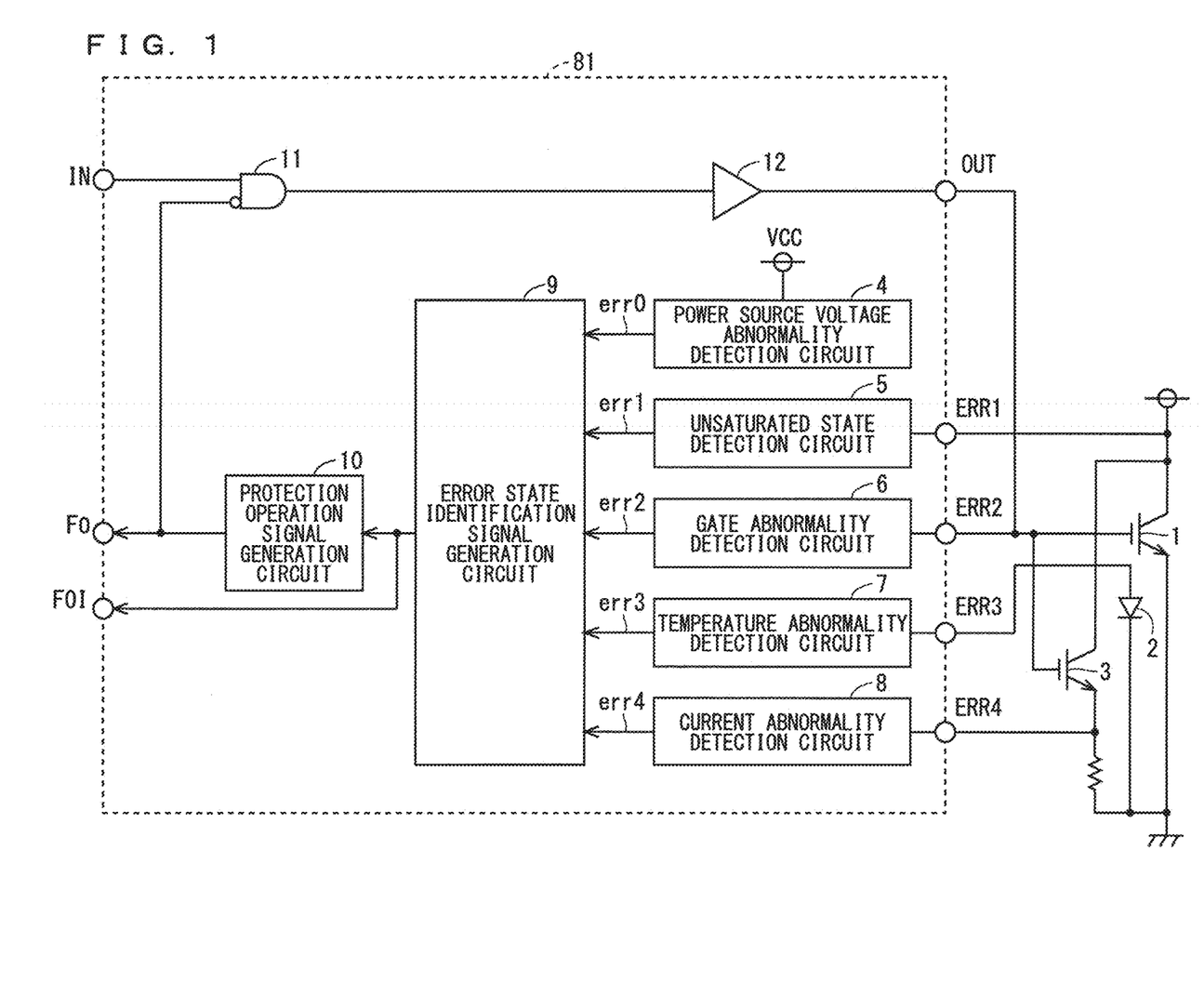
FIG. 1 is a diagram illustrating a configuration of a semiconductor element drive device according to an embodiment 1.

FIG. 1 is a diagram illustrating a configuration of a semiconductor element drive device 81 according to the present embodiment 1. The semiconductor element drive device 81 drives a semiconductor element 1. Provided to a chip (not shown) with the semiconductor element 1 are a temperature detection diode 2 embedded into the chip and a current detection transistor 3 for detecting current having correlation with current between a collector and an emitter of the semiconductor element 1.

In FIG. 1, the semiconductor element 1 and the current detection transistor 3 are insulated gate bipolar transistors (IGBTs), but may be metal oxide semiconductor field effect transistors (MOSFETs) or reverse conducting IGBTs (RC-IGBTs). The semiconductor element 1 and the current detection transistor 3 may be made of normal silicon (Si), or may also be made of wide bandgap semiconductor such as silicon carbide (SiC), gallium nitride (GaN), or diamond. When the semiconductor element 1 and the current detection transistor 3 are made up of wide bandgap semiconductor, a stable operation under high temperature and high voltage and increase of switching speed can be achieved.

The semiconductor element drive device 81 includes an input terminal IN, an output terminal OUT, error terminals ERR1, ERR2, ERR3, and ERR4, a protection operation signal output terminal FO, and an error state identification signal output terminal FOI. The input terminal IN is a terminal to which a drive pulse signal is inputted from an external control device not shown in the drawings, and the output terminal OUT is a terminal outputting a drive signal to a gate of the semiconductor element 1. The error terminals ERR1, ERR2, ERR3, and ERR4 are terminals for detecting an error state of the semiconductor element 1 or the semiconductor element drive device 81. The protection operation signal output terminal FO is a terminal outputting a protection operation signal described hereinafter, and the error state identification signal output terminal FOI is a terminal outputting an error state identification signal described hereinafter.

The semiconductor element drive device 81 in FIG. 1 includes a plurality of error state detection circuits, an error state identification signal generation circuit 9, a protection operation signal generation circuit 10, a protection circuit 11, and an amplifier 12.

The plurality of error state detection circuits according to the present embodiment 1 include a power source voltage abnormality detection circuit 4, an unsaturated state detection circuit 5, a gate abnormality detection circuit 6, a temperature abnormality detection circuit 7, and a current abnormality detection circuit 8. Each of the plurality of error state detection circuits detects the error state of the semiconductor element 1 or the semiconductor element drive device 81, and generates an error signal corresponding to the detected error state.

When the power source voltage abnormality detection circuit 4 detects an abnormality state of power source voltage of the semiconductor element drive device 81 as the error state, the power source voltage abnormality detection circuit 4 generates the error signal corresponding to the error state. For example, when the power source voltage abnormality detection circuit 4 detects an abnormality state where power source voltage VCC of the semiconductor element drive device 81 is equal to or smaller than predetermined voltage, the power source voltage abnormality detection circuit 4 generates and outputs an error signal err0.

When the unsaturated state detection circuit 5 detects an unsaturated state of the semiconductor element 1 while the semiconductor element 1 is an on state as an error state, the unsaturated state detection circuit 5 generates an error signal corresponding to the error state. For example, when the unsaturated state detection circuit 5 detects an abnormality state where collector-emitter voltage of the semiconductor element 1 does not decrease to predetermined saturated voltage while the semiconductor element 1 is a completely on state, the unsaturated state detection circuit 5 generates and outputs an error signal err1.

When the gate abnormality detection circuit 6 detects an abnormality state of a gate of the semiconductor element 1 as an error state, the gate abnormality detection circuit 6 generates an error signal corresponding to the error state. For example, when the gate 20 abnormality detection circuit 6 detects an abnormality state where gate voltage of the semiconductor element 1 does not increase to predetermined voltage or more within a predetermined time in a turn-on operation of the semiconductor element 1, the gate abnormality detection circuit 6 generates and outputs an error signal err2. For example, when the gate abnormality detection circuit 6 detects an abnormality state where gate voltage of the semiconductor element 1 does not decrease to predetermined voltage or less within a predetermined time in a turn-off operation of the semiconductor element 1, the gate abnormality detection circuit 6 generates and outputs an error signal err2.

When the temperature abnormality detection circuit 7 detects an abnormality state of a temperature of the semiconductor element 1 as an error state, the temperature abnormality detection circuit 7 generates an error signal corresponding to the error state. For example, when the temperature abnormality detection circuit 7 detects a chip temperature based on voltage between terminals of the temperature detection diode 2 and detects an abnormality state where the detected chip temperature is equal to or larger than a predetermined temperature, the temperature abnormality detection circuit 7 generates and outputs an error signal err3.

When the current abnormality detection circuit 8 detects an abnormality state of current of the semiconductor element 1 as an error state, the current abnormality detection circuit 8 generates an error signal corresponding to the error state. For example, when the current abnormality detection circuit 8 detects an abnormality state where current flowing between a collector and an emitter of the current detection transistor 3 is equal to or larger than predetermined current, the current abnormality detection circuit 8 determines that the abnormality state of the current of the semiconductor element 1 is detected, and generates and outputs the error signal err4.

Although details are described hereinafter, the error state identification signal generation circuit 9 generates an error state identification signal having a different waveform for each type of the error state based on the plurality of error signals err0, err1, err2, err3, and err4 each generated in the plurality of error state detection circuits. Described hereinafter is a case where the error state identification signal generation circuit 9 generates the error state identification signal having a different duty (also referred to as a duty ratio) for each type of the error state. As described hereinafter, the error state identification signal has a pulse width smaller than each of the error signals err0, err1, err2, err3, and err4.

The error state identification signal generation circuit 9 outputs the error state identification signal to an error state identification signal output terminal FOI and the protection operation signal generation circuit 10, and the error state identification signal is output outside the semiconductor element drive device 81 from the error state identification signal output terminal FOI. Accordingly, an external control device can identify a type of the error state from the error state identification signal.

The protection operation signal generation circuit 10 generates a protection operation signal for protecting the semiconductor element 1 based on the error state identification signal. For example, the protection operation signal generation circuit 10 performs filter processing on the error state identification signal, thereby generating a protection operation signal having a pulse width larger than a period of outputting the error state identification signal.

The protection operation signal generation circuit 10 outputs the protection operation signal to the protection operation signal output terminal FO and the protection circuit 11, and the protection operation signal is outputted outside the semiconductor element drive device 81 from the protection operation signal output terminal FO.

The protection circuit 11 protects the semiconductor element 1 based on the protection operation signal. For example, when the protection operation signal is not outputted from the protection operation signal generation circuit 10, the protection circuit 11 outputs a drive pulse signal inputted from the input terminal IN to the semiconductor element 1 via the amplifier 12, thereby driving the semiconductor element 1. In the meanwhile, when the protection operation signal is outputted from the protection operation signal generation circuit 10, the protection circuit 11 performs an error protection operation of stopping output of the drive pulse signal to the semiconductor element 1 via the amplifier 12 to stop driving of the semiconductor element 1.

The semiconductor element 1 is thereby protected. In the example in FIG. 1, the protection circuit 11 includes an AND circuit outputting a signal generated by a logical AND of a reversed protection operation signal and the drive pulse signal, however, the configuration is not limited thereto.

The amplifier 12 amplifies output of the protection circuit 11, and outputs the amplified output from the output terminal OUT to the gate of the semiconductor element 1.

Figure 2:
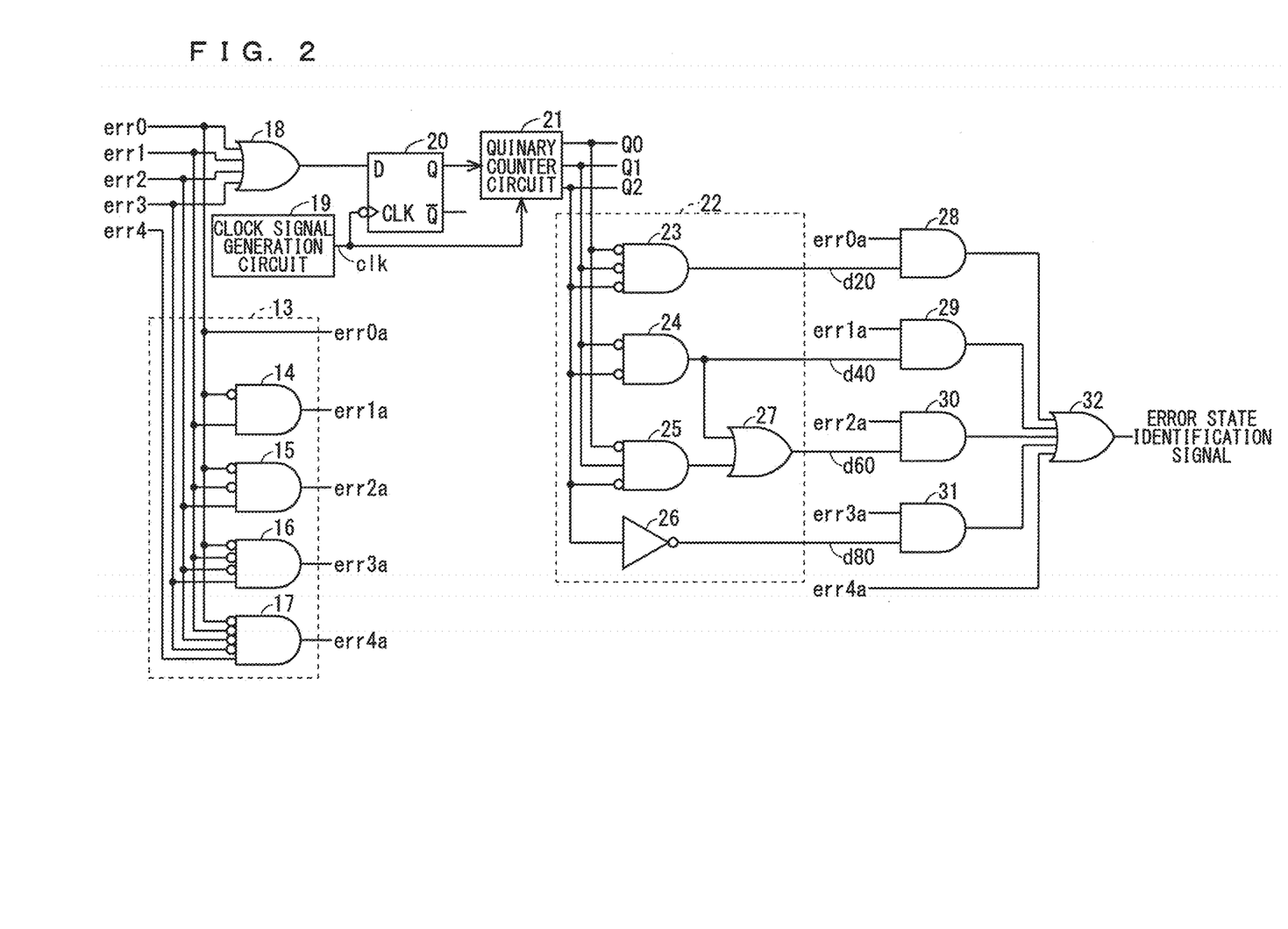
FIG. 2 is a circuit diagram illustrating a configuration of an error state identification signal generation circuit according to the embodiment 1.

FIG. 2 is a circuit diagram illustrating a configuration of the error state identification signal generation circuit 9 according to the present embodiment 1. The error state identification signal generation circuit 9 includes a priority circuit 13, an OR circuit 18, a clock signal generation circuit 19, a D flip-flop circuit 20, a quinary counter circuit 21, a pulse signal generation circuit 22, an AND circuits 28, 29, 30, and 31, and an OR circuit 32.

The priority circuit 13 includes AND circuits 14, 15, 16, and 17, and generates post-priority error signals err0a, err1a, err2a, err3a, and err 4a assigned with a priority order in an order of the error signals err0, err1, err2, err3, and err4. For example, when the error signal err0 is on (high), the post-priority error signal err0a is on, and the post-priority error signals err1a, err2a, err3a, and err4a are off (low) regardless of on and off of the error signals err1, err2, err3, and err4 having a lower priority order than the error signal err0. For example, when the error signal err0 is off, and the error signal err1 is on, the post-priority error signal err0a is off, the post-priority error signal err1a is on, and the post-priority error signals err2a, err3a, and err4a are off regardless of on and off of the error signals err2, err3, and err4 having a lower priority order than the error signal err1.

The post-priority error signals err0a, err1a, err3a, and err3a are inputted to the AND circuits 28, 29, 30, and 31, and the post-priority error signal err4a is inputted to the OR circuit 32.

The error signals err0, err1, err2, err3, and err4 are inputted to the OR circuit 18 separately from the priority circuit 13. An output signal of the OR circuit 18 and a clock signal clk generated in the clock signal generation circuit 19 are inputted to a D terminal and a CLK terminal of the D flip-flop circuit 20, respectively.

The quinary counter circuit 21 outputs counter circuit output signals Q0, Q1, and Q2 based on an output signal of a Q terminal of the D flip-flop circuit 20 and the clock signal clk.

The pulse signal generation circuit 22 includes AND circuits 23, 24, and 25 in
which all of inputs are reversed, an inverter circuit 26, and an OR circuit 27. The pulse signal generation circuit 22 generates a pulse signal d20 with a duty of 20%, a pulse signal d40 with a duty of 40%, a pulse signal d60 with a duty of 60%, and a pulse signal d80 with a duty of 80% based on the counter circuit output signals Q0, Q1, and Q2. The pulse signals d20, d40, d60, and d80 substantially have the same frequency as each other, generally ⅕ times the frequency of the clock signal clk.

The post-priority error signals erroa, err1a, err2a, and err3a and the pulse signals d20, d40, d60, and d80 are inputted to the AND circuits 28, 29, 30, and 31, respectively. The OR circuit 32 outputs the error state identification signal based on the output signal of the AND circuits 28, 29, 30, and 31 and the post-priority error signal err4a.

Figure 3:
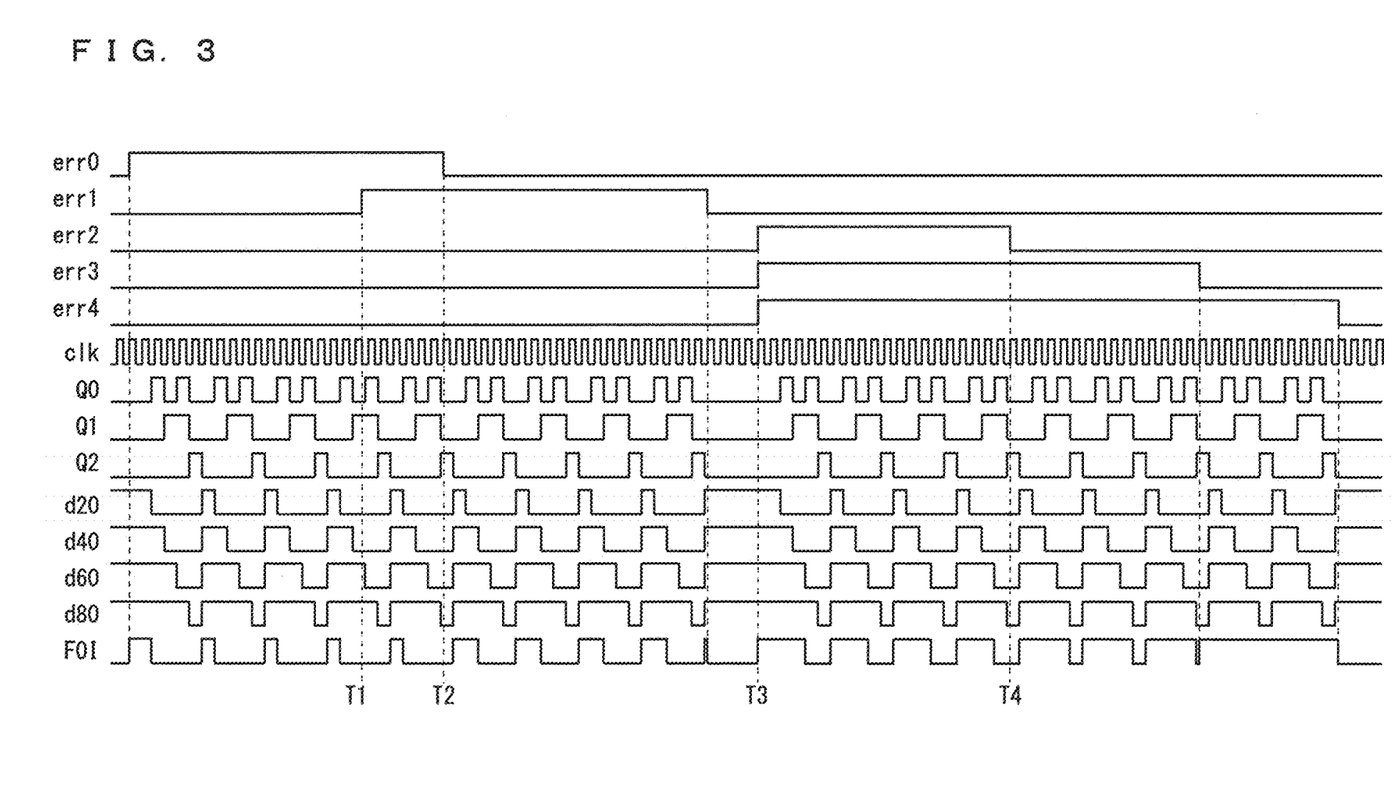
FIG. 3 is a timing chart illustrating an operation of the error state identification signal generation circuit according to the embodiment 1.

FIG. 3 is a timing chart illustrating an operation of the error state identification signal generation circuit 9 according to the present embodiment 1.

As illustrated in FIG. 3, the error state identification signal generation circuit 9 outputs a pulse signal in which a duty corresponds to the error signal as the error state identification signal. The duties of 20%, 40%, 60%, 80%, and 100% correspond to the error signals err0, err1, err2, err3, and err4, respectively. In this manner, the error state identification signal generation circuit 9 generates an error state identification signal having a different duty for each type of the error state based on the plurality of error signals err1, err2, err3, and err4 each generated in the plurality of error state detection circuits. As illustrated in FIG. 3, the error state identification signal has a pulse width smaller than each of the error signals err0, err1, err2, err3, and err4. The time from start to finish of output of the error state identification signal is short, thus the external control device can identify the type of the error state in an early stage from the error state identification signal outputted from the error state identification signal output terminal FOI.

When the plurality of error signals are outputted at the same time, a pulse signal having a duty corresponding to an error signal having a highest priority order in the plurality of outputted error signals is outputted as the error state identification signal. For example, in a period of T1 to T2 in which the error signals err0 and err1 are outputted, the pulse signal having a duty of 20% corresponding to the error signal err0 having a higher priority order than the error signal err1 is outputted as the error state identification signal. For example, in a period of T3 to T4 in which the error signals err2, err3, and err4 are outputted, the pulse signal having a duty of 60% corresponding to the error signal err2 having a higher priority order than the error signals err3 and err4 is outputted as the error state identification signal.

Figure 4:
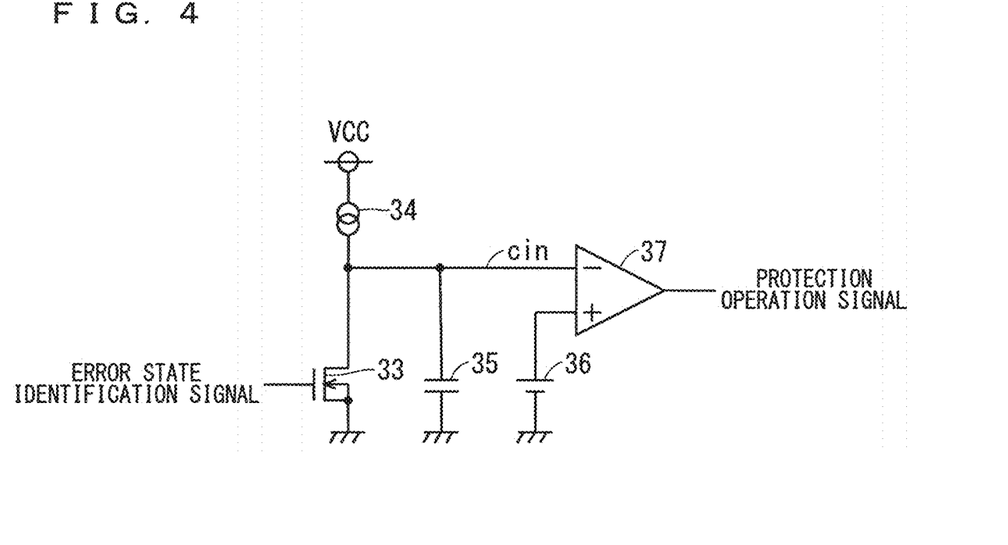
FIG. 4 is a circuit diagram illustrating a configuration of a protection operation signal generation circuit according to the embodiment 1.

FIG. 4 is a circuit diagram illustrating a configuration of the protection operation signal generation circuit 10 according to the present embodiment 1. The protection operation signal generation circuit 10 includes a transistor 33, a current source 34, a capacitor 35, a power source 36, and a comparator 37.

The transistor 33 and the current source 34 perform discharge and charge of the capacitor 35 based on the error state identification signal. The comparator 37 outputs an output signal as a protection operation signal based on a comparative result of voltage of the capacitor 35 and voltage of the power source 36.

Figure 5:
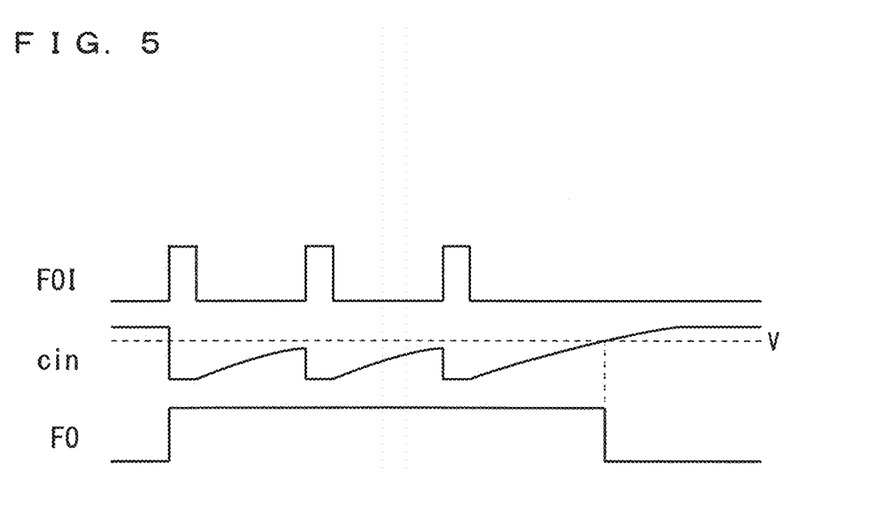
FIG. 5 is a timing chart illustrating an operation of the protection operation signal generation circuit according to the embodiment 1.

FIG. 5 is a time chart illustrating an operation of the protection operation signal generation circuit 10 according to the present embodiment 1. FIG. 5 illustrates an error state identification signal of the error state identification signal output terminal FOI, voltage cin of the capacitor 35, and a protection operation signal of the protection operation signal output terminal FO.

As illustrated in FIG. 5, a current value of current which the current source 34 flows and a capacity value of the capacitor 35 are set so that the voltage cin of the capacitor 35 does not increase to voltage V of the power source 36 during a period of outputting the error state identification signal. The protection operation signal generation circuit 10 having such a configuration can output the protection operation signal during a period equal to or longer than the period of outputting the error state identification signal, thus the protection operation signal having the pulse width equal to or longer than the period of outputting the error state identification signal can be generated.

Outline of Embodiment 1

According to the semiconductor element drive device 81 of the present embodiment 1, the error state identification signal having the different waveform for each type of the error state is generated, the protection operation signal is generated based on the error state identification signal, and the error state identification signal and the protection operation signal are outputted from the error state identification signal output terminal FOI and the protection operation signal output terminal FO, respectively. According to such a configuration, the external control device can identify the error state during the protection operation due to an error. The error state identification signal has the smaller pulse width than each error signal, thus the external control device can identify the type of error state in the early stage. Furthermore, the error state identification signal is outputted from one error state identification signal output terminal FOI, thus the terminal needs not be provided for each type of error state, and the number of terminals can be reduced.

Modification Example of Embodiment 1

Described in the embodiment 1 is the case where the plurality of error state detection circuits include the power source voltage abnormality detection circuit 4, the unsaturated state detection circuit 5, the gate abnormality detection circuit 6, the temperature abnormality detection circuit 7, and the current abnormality detection circuit 8. However, the plurality of error state detection circuits may include at least two of these circuits, or may also include a circuit detecting an abnormality state other than that described above. That is to say, even when the type and the number of the plurality of error state detection circuits are not limited thereto described above, the effect similar to that according to the embodiment 1 can be obtained. In the present specification, at least one (two) of A, B, C, . . . , and Z indicates any one (two) of all of combinations of one type (two types) or more from a group of A, B, C, . . . , and Z.

The temperature detection diode 2 and the current detection transistor 3 need not be provided in accordance with the configurations of the plurality of error state detection circuits.

Described in the embodiment 1 is the case where the error state identification signal generation circuit 9 generates the error state identification signal having the different duty for each type of error signal. However, it is sufficient that the error state identification signal generation circuit 9 is a circuit generating a signal by which an error state can be identified, and may also be a circuit generating an error state identification signal having at least one of a duty, a frequency, and an amplitude different for each type of error signal, for example.

When applied to the protection operation signal generation circuit 10 is a circuit generating a protection operation signal having a pulse width equal to or larger than a period of outputting the error state identification signal, the effect similar to that in the embodiment 1 can be obtained even if the protection operation signal generation circuit 10 is not the circuit in FIG. 4. In the similar manner, the error state identification signal generation circuit 9 may not be the circuit in FIG. 2.

Embodiment 2

Figure 6:
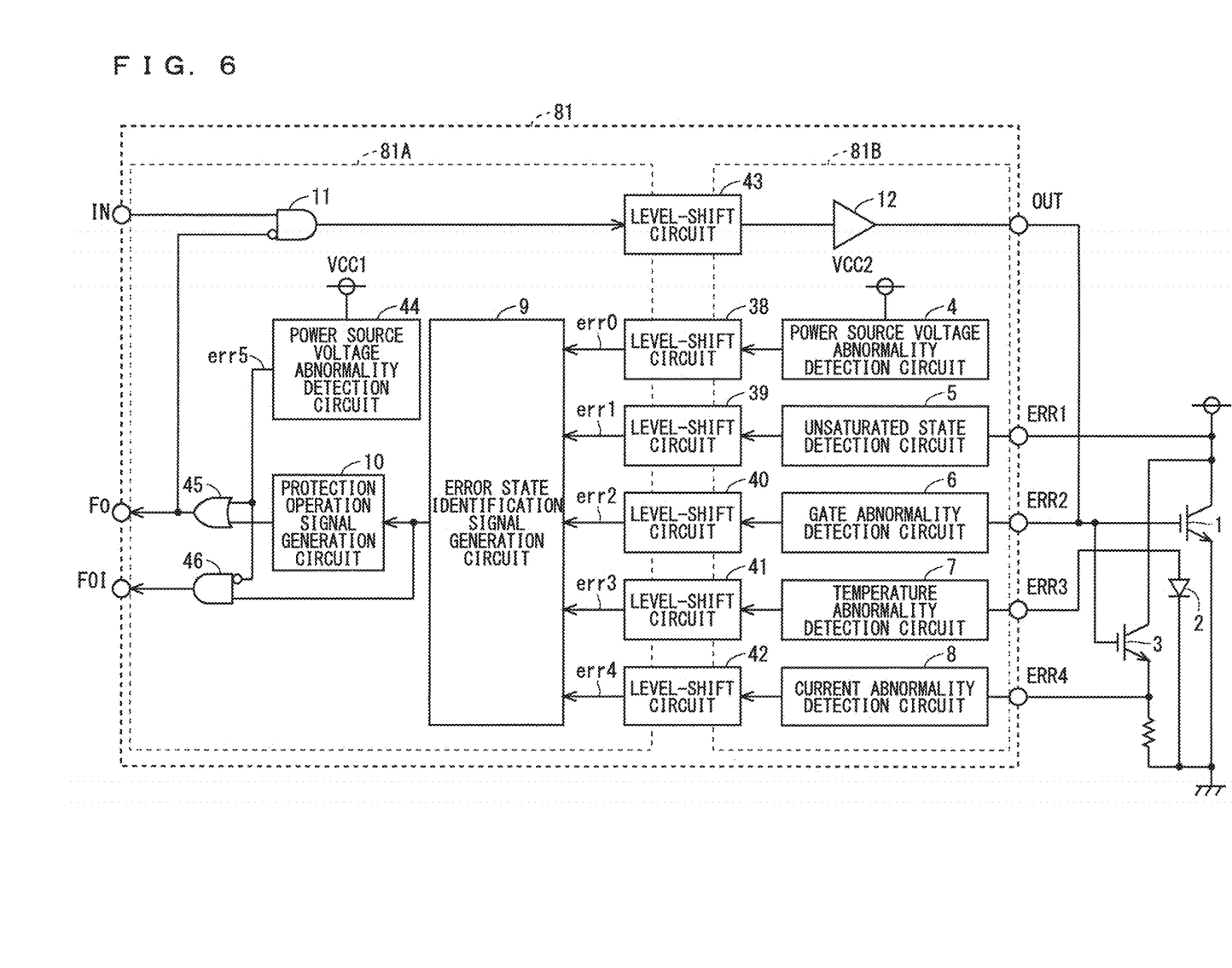
FIG. 6 is a diagram illustrating a configuration of a semiconductor element drive device according to an embodiment 2.

FIG. 6 is a diagram illustrating a configuration of the semiconductor element drive device 81 according to the present embodiment 2. The semiconductor element drive device 81 according to the present embodiment 2 includes a primary circuit 81A, a secondary circuit 81B, and level-shift circuits 38, 39, 40, 41, 42, and 43.

The primary circuit 81A includes the error state identification signal generation circuit 9, the error state identification signal output terminal FOI, the protection operation signal generation circuit 10, the protection operation signal output terminal FO, the protection circuit 11, and the input terminal IN according to the embodiment 1 illustrated in FIG. 1. The primary circuit 81A transmits a signal to an external control device outside the semiconductor element drive device 81, and receives a drive signal for driving the semiconductor element 1 from the external control device in the input terminal IN.

The primary circuit 81A includes a power source voltage abnormality detection circuit 44, an OR circuit 45, and an AND circuit 46 in which an input on one side is reversed.

When the power source voltage abnormality detection circuit 44 detects an abnormality state of power source voltage VCCI of the primary circuit 81A, the power source voltage abnormality detection circuit 44 generates and outputs an error signal err5. The OR circuit 45 outputs a signal indicating a logical OR of the error signal err5 outputted from the power source voltage abnormality detection circuit 44 and a protection operation signal outputted from the protection operation signal generation circuit 10 to the protection circuit 11 and the protection operation signal output terminal FO. The AND circuit 46 outputs the signal indicating the logical AND of the error signal err5 which is outputted from the power source voltage abnormality detection circuit 44 and reversed and the error state identification signal outputted from the error state identification signal generation circuit 9 to the error state identification signal output terminal FOI.

According to such a configuration, when the error signal err5 is not outputted from the power source voltage abnormality detection circuit 44, the protection operation signal and the error state identification signal can be outputted from the protection operation signal output terminal FO and the error state identification signal output terminal FOI in the manner similar to the embodiment 1.

In the meanwhile, when the error signal err5 is outputted from the power source voltage abnormality detection circuit 44, an on signal is outputted from the protection operation signal output terminal FO, and the error state identification signal is not outputted from the error state identification signal output terminal FOI, but an off signal is outputted therefrom.

The secondary circuit 81B drives the semiconductor element 1 based on a drive signal substantially received by the primary circuit 81A. The secondary circuit 81B includes the power source voltage abnormality detection circuit 4, the unsaturated state detection circuit 5, the gate abnormality detection circuit 6, the temperature abnormality detection circuit 7, the current abnormality detection circuit 8, and the amplifier 12 according to the embodiment 1 in FIG. 1. When the power source voltage abnormality detection circuit 4 detects an abnormality state of power source voltage VCC2 of the secondary circuit 81B, the power source voltage abnormality detection circuit 4 generates and outputs the error signal err0.

The level-shift circuit 43 level-shifts a drive signal received in the primary circuit 81A and transmits the drive signal to the secondary circuit 81B. The level-shift circuits 38, 39, 40, 41, and 42 level-shifts the plurality of error signals err0, err1, err2, err3, and err4 generated in the secondary circuit 81B and transmits the error signals err0, err1, err2, err3, and err4 to the primary circuit 81A.

Outline of Embodiment 2

According to the semiconductor element drive device 81 of the present embodiment 2 described above, the secondary circuit 81B can drive the semiconductor element 1 by the level-shift circuits 38, 39, 40, 41, 42, and 43 based on the drive signal received in the primary circuit 81A, and the primary circuit 81A can identify the error state detected in the secondary circuit 81B.

When the signal of the error state identification signal output terminal FOI is off and the signal of the protection operation signal output terminal FO is on, the external control device can determine that the power source voltage abnormality is detected in the primary circuit 81A. Thus, the external control device can identify the error state detected in the primary circuit 81A and the error state detected in the secondary circuit 81B. A dedicated terminal for the error state of the primary circuit 81A needs not be provided, thus the number of terminals can be reduced.

Modification Example of Embodiment 2

Described in the embodiment 2 is the configuration that the error state identification signal from the error state identification signal generation circuit 9 and the protection operation signal from the protection operation signal generation circuit 10 are changed based on the output of the power source voltage abnormality detection circuit 44. However, the error state identification signal generation circuit 9 may generate the error state identification signal corresponding to the error state of the primary circuit 81A and the secondary circuit 81B based on the output of the power source voltage abnormality detection circuit 44 and the error signal of the secondary circuit 81B. According to such a configuration, the protection operation signal can be outputted from the protection operation signal output terminal FO and the error state identification signal can be outputted from the error state identification signal output terminal FOI without using the OR circuit 45 and the AND circuit 46.

Embodiment 3

Figure 7:
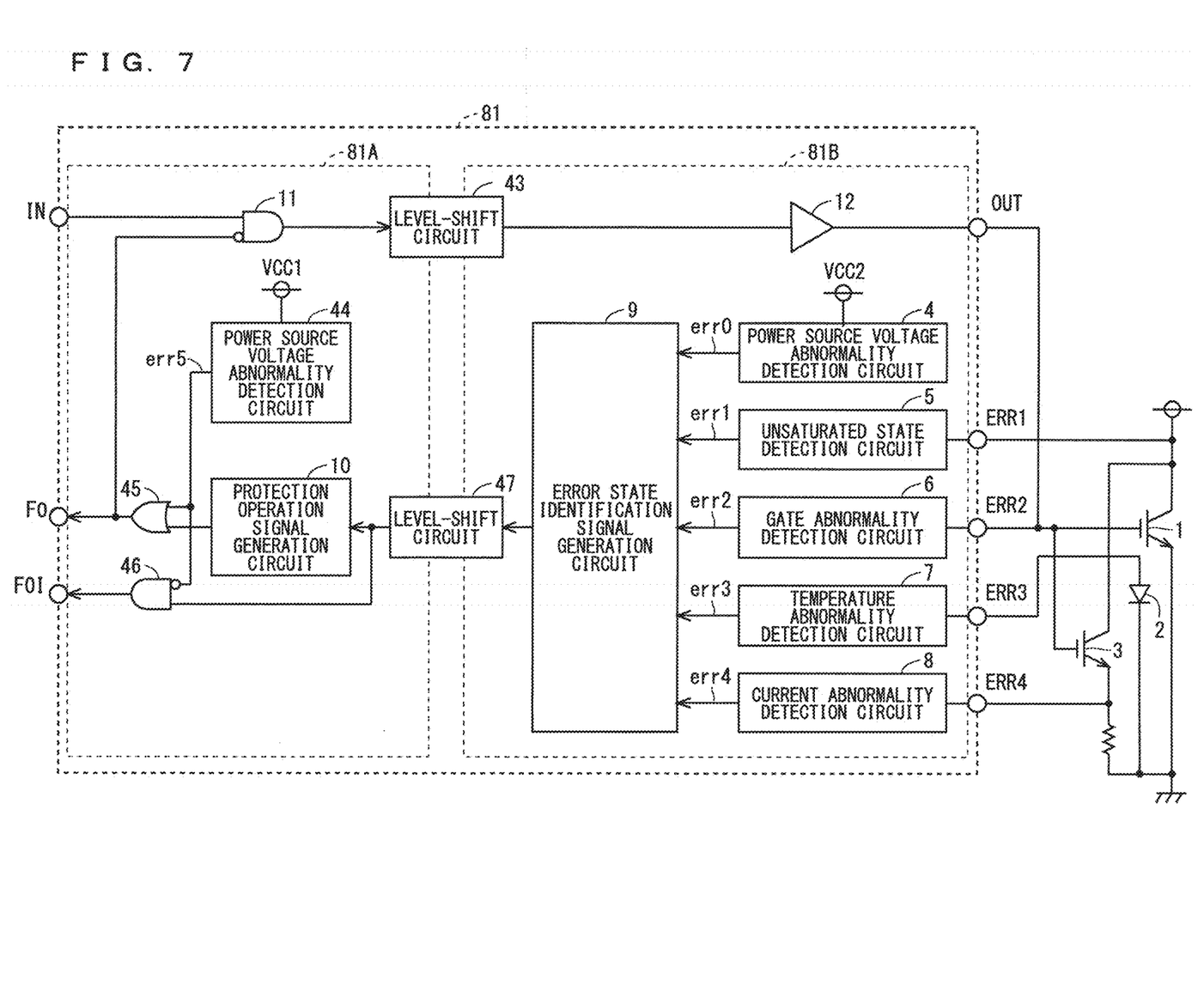
FIG. 7 is a diagram illustrating a configuration of a semiconductor element drive device according to an embodiment 3.

FIG. 7 is a diagram illustrating a configuration of the semiconductor element drive device 81 according to the present embodiment 3. The configuration of the present embodiment 3 is similar to the configuration of the present embodiment 2 illustrated in FIG. 6 except that that the error state identification signal generation circuit 9 is included in the secondary circuit 81B and a level-shift circuit 47 is provided in place of the level-shift circuits 38, 39, 40, 41, and 42. The level-shift circuit 47 level-shifts the error state identification signal generated in the secondary circuit 81B and transmits the error state identification signal to the primary circuit 81A.

Outline of Embodiment 3

According to the semiconductor element drive device 81 of the present embodiment 3 described above, the error state identification signal generation circuit 9 is included in the secondary circuit 81B, thus the level-shift circuit needs not be provided for each error state. As a result of this configuration, reduction of a circuit area and consumed current of the semiconductor element drive device 81 can be expected.

Embodiment 4

Figure 8:
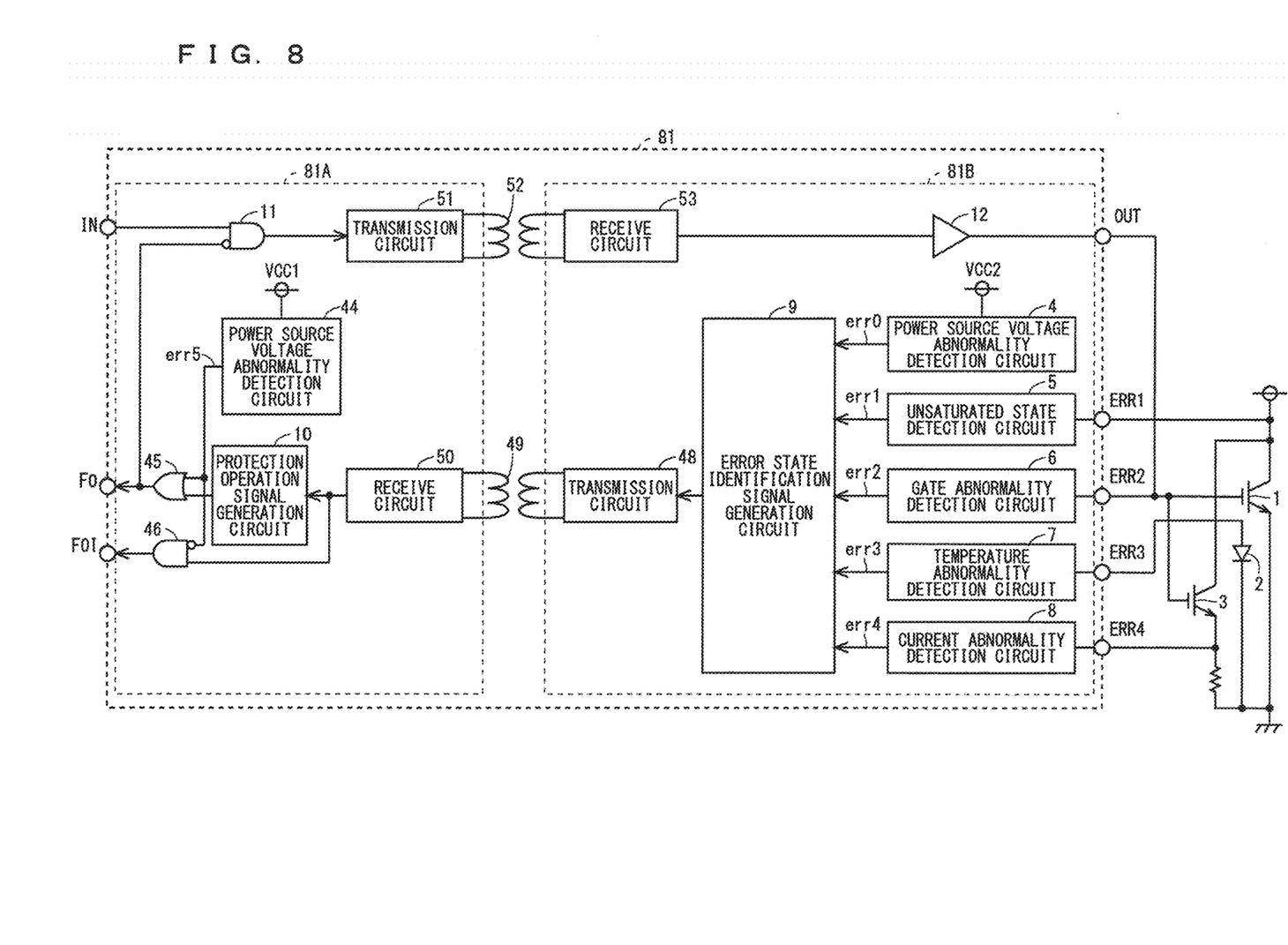
FIG. 8 is a diagram illustrating a configuration of a semiconductor element drive device according to an embodiment 4.

FIG. 8 is a diagram illustrating a configuration of the semiconductor element drive device 81 according to the present embodiment 4. The configuration of the present embodiment 4 is similar to the configuration of the embodiment 3 illustrated in FIG. 7 except that a transmission circuit 48, a transformer 49, and a receive circuit 50 are provided in place of the level-shift circuit 47, and a transmission circuit 51, a transformer 52, and a receive circuit 53 are provided in place of the level-shift circuit 43. The transmission circuits 48 and 51, the transformers 49 and 52, and the receive circuits 50 and 53 are included in a concept of an insulating element.

The transmission circuit 48, the transformer 49, and the receive circuit 50 transmit the error state identification signal generated in the secondary circuit 81B to the primary circuit 81A as an alternating current signal. The transmission circuit 48, the transformer 49, and the receive circuit 50 insulate a direct current signal between the primary circuit 81A and the secondary circuit 81B.

The transmission circuit 51, the transformer 52, and the receive circuit 53 transmit a drive signal received in the primary circuit 81A to the secondary circuit 81B as an alternating current signal. The transmission circuit 51, the transformer 52, and the receive circuit 53 insulate a direct current signal between the primary circuit 81A and the secondary circuit 81B.

Outline of Embodiment 4

According to the semiconductor element drive device 81 of the present embodiment 3 described above, the signal can be transmitted while the direct current signal between the primary circuit 81A and the secondary circuit 81B is insulated.

Modification Example of Embodiment 4

In the embodiment 4, the insulating element includes the transformers 49 and 52, but may not include the transformers 49 and 52 when the signal can be transmitted while the direct current signal between the primary circuit 81A and the secondary circuit 81B is insulated. For example, the insulating element may include a capacitor in place of the transformers 49 and 52. The insulating element may include a photo coupler capable of transmitting an optical signal which is not a direct current signal. An effect similar to that in the embodiment 4 is obtained also in this case.

Each embodiment and each modification example can be arbitrarily combined, or each embodiment and each modification can be appropriately varied or omitted.

The aspects of the present disclosure are collectively described hereinafter as appendixes.

APPENDIX 1

A semiconductor element drive device driving a semiconductor element, comprising:
    a plurality of error state detection circuits each detecting an error state of the semiconductor element or the semiconductor element drive device and generating at least one error signal corresponding to the error state which has been detected;
    an error state identification signal generation circuit generating an error state identification signal having a different waveform for each type of the error state and having a smaller pulse width than each of the error signals based on the plurality of error signals generated in the plurality of error state detection circuits, respectively;

an error state identification signal output terminal outputting the error state identification signal;
a protection operation signal generation circuit generating a protection operation signal for protecting the semiconductor element based on the error state identification signal;
a protection operation signal output terminal outputting the protection operation signal; and
a protection circuit protecting the semiconductor element based on the protection operation signal.

APPENDIX 2

The semiconductor element drive device according to Appendix 1, wherein
the plurality of error state detection circuits include at least two of:
a power source voltage abnormality detection circuit detecting an abnormality state of power source voltage of the semiconductor element drive device as the error state;
an unsaturated state detection circuit detecting an unsaturated state of the semiconductor element while the semiconductor element is an on state as the error state;
a gate abnormality detection circuit detecting an abnormality state of a gate of the semiconductor element as the error state;
a temperature abnormality detection circuit detecting an abnormality state of a temperature of the semiconductor element as the error state; and
a current abnormality detection circuit detecting an abnormality state of current of the semiconductor element as the error state.

APPENDIX 3

The semiconductor element drive device according to Appendix 1 or 2, wherein
at least one of a duty, a frequency, and an amplitude of the error state identification signal is different for the each type of the error state, thus the waveform of the error state identification signal is different.

APPENDIX 4

The semiconductor element drive device according to any one of Appendixes 1 to 3, wherein
a pulse width of the protection operation signal is equal to or larger than a period of outputting the error state identification signal.

APPENDIX 5

The semiconductor element drive device according to any one of Appendixes 1 to 4, wherein
the error state identification signal generation circuit, the error state identification signal output terminal, the protection operation signal generation circuit, the protection operation signal output terminal, and the protection circuit are included in a primary circuit receiving a drive signal for driving the semiconductor element from outside of the semiconductor element drive device,
the plurality of error state detection circuits are included in a secondary circuit driving the semiconductor element and including and
the semiconductor element drive device further comprising:
a level-shift circuit level-shifting the drive signal received in the primary circuit and transmitting the drive signal to the secondary circuit and level-shifting the plurality of error signals generated in the secondary circuit and transmitting the plurality of error signals to the primary circuit.

APPENDIX 6

The semiconductor element drive device according to any one of Appendixes 1 to 4, wherein
the error state identification signal output terminal, the protection operation signal generation circuit, the protection operation signal output terminal, and the protection circuit are included in a primary circuit receiving a drive signal for driving the semiconductor element from outside of the semiconductor element drive device,
the plurality of error state detection circuits and the error state identification signal generation circuit are included in a secondary circuit driving the semiconductor element and including and
the semiconductor element drive device further comprising:
a level-shift circuit level-shifting the drive signal received in the primary circuit and transmitting the drive signal to the secondary circuit and level-shifting the error state identification signal generated in the secondary circuit and transmitting the error state identification signal to the primary circuit.

APPENDIX 7

The semiconductor element drive device according to any one of Appendixes 1 to 4, wherein
the error state identification signal output terminal, the protection operation signal generation circuit, the protection operation signal output terminal, and the protection circuit are included in a primary circuit receiving a drive signal for driving the semiconductor element from outside of the semiconductor element drive device,
the plurality of error state detection circuits and the error state identification signal generation circuit are included in a secondary circuit driving the semiconductor element and
the semiconductor element drive device further comprising:
an insulating element transmitting the drive signal received in the primary circuit to the secondary circuit as a signal other than a direct current signal, transmitting the error state identification signal generated in the secondary circuit to the primary circuit as a signal other than a direct current signal, and insulating direct current signals between the primary circuit and the secondary circuit.

APPENDIX 8

The semiconductor element drive device according to any one of Appendixes 5 to 7, further comprising
a power source voltage abnormality detection circuit included in the primary circuit and detecting an abnormality state of power source voltage of the primary circuit.

While the invention has been shown and described in detail, the foregoing description is in all aspects illustrative and not restrictive. It is therefore understood that numerous modifications and variations can be devised without departing from the scope of the invention.

What is claimed is:

1. A semiconductor element drive device driving a semiconductor element, comprising:
    a plurality of error state detection circuits each detecting an error state of the semiconductor element or the semiconductor element drive device and generating at least one error signal corresponding to the error state which has been detected;
    an error state identification signal generation circuit generating an error state identification signal having a different waveform for each type of the error state and having a smaller pulse width than each of the error signals based on the plurality of error signals generated in the plurality of error state detection circuits, respectively;
    an error state identification signal output terminal outputting the error state identification signal;
    a protection operation signal generation circuit generating a protection operation signal for protecting the semiconductor element based on the error state identification signal;
    a protection operation signal output terminal outputting the protection operation signal; and
    a protection circuit protecting the semiconductor element based on the protection operation signal.

2. The semiconductor element drive device according to claim 1, wherein
    the plurality of error state detection circuits include at least two of:
    a power source voltage abnormality detection circuit detecting an abnormality state of power source voltage of the semiconductor element drive device as the error state;
    an unsaturated state detection circuit detecting an unsaturated state of the semiconductor element while the semiconductor element is an on state as the error state;
    a gate abnormality detection circuit detecting an abnormality state of a gate of the semiconductor element as the error state;
    a temperature abnormality detection circuit detecting an abnormality state of a temperature of the semiconductor element as the error state; and
    a current abnormality detection circuit detecting an abnormality state of current of the semiconductor element as the error state.

3. The semiconductor element drive device according to claim 1, wherein
    at least one of a duty, a frequency, and an amplitude of the error state identification signal is different for the each type of the error state, thus the waveform of the error state identification signal is different.

4. The semiconductor element drive device according to claim 1, wherein
    a pulse width of the protection operation signal is equal to or larger than a period of outputting the error state identification signal.

5. The semiconductor element drive device according to claim 1, wherein
    the error state identification signal generation circuit, the error state identification signal output terminal, the protection operation signal generation circuit, the protection operation signal output terminal, and the protection circuit are included in a primary circuit receiving a drive signal for driving the semiconductor element from outside of the semiconductor element drive device,
    the plurality of error state detection circuits are included in a secondary circuit driving the semiconductor element and
    the semiconductor element drive device further comprising:
    a level-shift circuit level-shifting the drive signal received in the primary circuit and transmitting the drive signal to the secondary circuit and level-shifting the plurality of error signals generated in the secondary circuit and transmitting the plurality of error signals to the primary circuit.

6. The semiconductor element drive device according to claim 5, further comprising
    a power source voltage abnormality detection circuit included in the primary circuit and detecting an abnormality state of power source voltage of the primary circuit.

7. The semiconductor element drive device according to claim 1, wherein
    the error state identification signal output terminal, the protection operation signal generation circuit, the protection operation signal output terminal, and the protection circuit are included in a primary circuit receiving a drive signal for driving the semiconductor element from outside of the semiconductor element drive device,
    the plurality of error state detection circuits and the error state identification signal generation circuit are included in a secondary circuit driving the semiconductor element and
    the semiconductor element drive device further comprising:
    a level-shift circuit level-shifting the drive signal received in the primary circuit and transmitting the drive signal to the secondary circuit and level-shifting the error state identification signal generated in the secondary circuit and transmitting the error state identification signal to the primary circuit.

8. The semiconductor element drive device according to claim 1, wherein
    the error state identification signal output terminal, the protection operation signal generation circuit, the protection operation signal output terminal, and the protection circuit are included in a primary circuit receiving a drive signal for driving the semiconductor element from outside of the semiconductor element drive device,
    the plurality of error state detection circuits and the error state identification signal generation circuit are included in a secondary circuit driving the semiconductor element and
    the semiconductor element drive device further comprising:
    an insulating element transmitting the drive signal received in the primary circuit to the secondary circuit as a signal other than the direct current signal, transmitting the error state identification signal generated in the secondary circuit to the primary circuit as a signal other than a direct current signal, and insulating direct current signals between the primary circuit and the secondary circuit.

* * * * *